(12) United States Patent
Sykora et al.

(10) Patent No.: US 9,837,564 B1
(45) Date of Patent: Dec. 5, 2017

(54) ACTINIDE OXIDE PHOTODIODE AND NUCLEAR BATTERY

(71) Applicant: Los Alamos National Security, LLC, Los Alamos, NM (US)

(72) Inventors: Milan Sykora, Los Alamos, NM (US); Igor Usov, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 0 days.

(21) Appl. No.: 15/274,152

(22) Filed: Sep. 23, 2016

Related U.S. Application Data

(63) Continuation-in-part of application No. 15/188,152, filed on Jun. 21, 2016.

(60) Provisional application No. 62/191,601, filed on Jul. 13, 2015.

(51) Int. Cl.
| | |
|---|---|
| *H01L 31/06* | (2012.01) |
| *H01L 31/032* | (2006.01) |
| *H01L 31/103* | (2006.01) |
| *H01L 31/0224* | (2006.01) |
| *H01L 31/18* | (2006.01) |

(52) U.S. Cl.
CPC .... *H01L 31/032* (2013.01); *H01L 31/022408* (2013.01); *H01L 31/103* (2013.01); *H01L 31/18* (2013.01)

(58) Field of Classification Search
CPC ..... H01L 31/18; H01L 31/032; H01L 31/103; H01L 31/022408; H01L 27/288; H01L 27/14643

USPC .......................................... 257/460, 461, 462
See application file for complete search history.

(56) References Cited

U.S. PATENT DOCUMENTS

| | | | |
|---|---|---|---|
| 6,730,538 B1 * | 5/2004 | Meek ................ | H01L 21/31604 257/E21.274 |
| 2012/0080712 A1 * | 4/2012 | Tanimoto ............ | H01L 33/0095 257/99 |
| 2014/0270041 A1 * | 9/2014 | Burgett .................. | G21C 17/10 376/259 |

OTHER PUBLICATIONS

R.R. Price, M.J. Haire, and A.G. Croff, "Potential Uses of Depleted Uranium," International Winter and Embedded Topical Meetings, Washington D.C. (Nov. 12-16, 2000).

* cited by examiner

*Primary Examiner* — Brook Kebede
(74) *Attorney, Agent, or Firm* — LeonardPatel PC

(57) ABSTRACT

Photodiodes and nuclear batteries may utilize actinide oxides, such a uranium oxide. An actinide oxide photodiode may include a first actinide oxide layer and a second actinide oxide layer deposited on the first actinide oxide layer. The first actinide oxide layer may be n-doped or p-doped. The second actinide oxide layer may be p-doped when the first actinide oxide layer is n-doped, and the second actinide oxide layer may be n-doped when the first actinide oxide layer is p-doped. The first actinide oxide layer and the second actinide oxide layer may form a p/n junction therebetween. Photodiodes including actinide oxides are better light absorbers, can be used in thinner films, and are more thermally stable than silicon, germanium, and gallium arsenide.

17 Claims, 6 Drawing Sheets

ACTINIDE OXIDE PHOTODIODE AND NUCLEAR BATTERY

CROSS REFERENCE TO RELATED APPLICATIONS

This application is a continuation-in-part of, and claims priority to, U.S. patent application Ser. No. 15/188,152 filed on Jun. 21, 2016, which claims the benefit of U.S. Provisional Patent Application No. 62/191,601 filed on Jul. 13, 2015. The subject matter of these earlier filed applications is hereby incorporated by reference in its entirety.

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD

The present invention generally relates to components incorporating actinide oxides, and more particularly, to actinide oxide photodiodes and nuclear batteries.

BACKGROUND

Photodiodes are devices designed and used to sense and detect light at various wavelengths (or energies) and intensities by converting incident radiant power into electrical power, where the intensity of the produced electrical signal is proportional to the power of the incident light. These devices are typically fabricated using semiconductor materials, such as silicon (Si), germanium (Ge), indium (In), gallium arsenide (GaAs), or combinations thereof, as the active, light-sensitive component. The key component of the device is a p/n junction, which is an interface between the positively doped p-region and negatively doped n-region of a semiconductor. The doping is achieved by incorporation of an element with a deficiency (p) or excess (n) of electrons into the semiconductor.

The principle of operation of a photodiode is based on the photoelectric effect. When a photon of sufficient energy strikes the photodiode, it creates an electron-hole pair. If the electron and "hole" are generated near the p/n junction, they are swept from the junction by the internal electric field. The holes are collected at the anode, and the electrons are collected at the cathode (typically with the help of an applied external electric field), producing photocurrent with magnitude proportional to the number of absorbed photons. Commercially available photodiodes have number of limitations, such as limited sensitivity (or spectral responsivity), low temperature stability, low resistance to ionizing radiation, etc. Accordingly, an improved photodiode may be beneficial.

Nuclear batteries are devices designed and used to convert the energy of a decaying radioactive material into electrical energy. The primary application of nuclear batteries is their use as a long-lasting energy source, where the lifetime of the battery is related to the half-life of the radioactive material. These half-lives can be as long as years or centuries. The conversion of the radiated isotope energy into electrical energy in a nuclear battery can be based on several effects/principles, such as: alpha-voltaic, beta-voltaic, gamma-voltaic, scintillation intermediate, thermoelectric, thermophotoelectric, direct charge collection, and thermionic.

In case of alpha-voltaics, beta-voltaics, or gamma voltaics, for example, $\alpha$, $\beta$, or $\gamma$ radiation produced by the radioactive isotope is captured and directly converted into electrons and holes in a semiconductor material. The separation of the generated electrons and holes is achieved by incorporation of a p/n junction into a semiconductor material. In case of scintillation intermediate, $\alpha$, $\beta$, or $\gamma$ radiation produced by the radioactive isotope is first captured by a liquid or solid scintillator material that absorbs the ionizing radiation and remits the radiation in the form of ultraviolet (UV), visible, or near-infrared photons. These photons are then absorbed by an adjacent semiconductor material and converted into electricity via a photovoltaic effect in the same fashion as in a traditional solar cell. Commercially available silicon solar cells have been explored in this application.

In a thermoelectric version of a nuclear battery, the heat generated by the decay of a radioisotope is converted into electricity through the Seebeck effect. In principle, a nuclear battery can generate electricity through one or combination of these effects.

A common feature of all nuclear battery designs is that they use a semiconductor material to convert the energy of the radioisotope into the electrical energy. This design requirement is also a source of limitation for the nuclear batteries as the semiconductors degrade upon exposure to the ionizing radiation. Ionizing radiation displaces atoms within the crystal lattice of the semiconductor, thus creating a vacancy. The rate of displacement is directly proportional to the power density of the radiation produced by the source material. Thus, the high power density of the ionizing material necessary for efficient generation of electricity is typically responsible for rapid degradation of performance of nuclear batteries. Accordingly, an improved nuclear battery may be beneficial.

SUMMARY

Certain embodiments of the present invention may provide solutions to the problems and needs in the art that have not yet been fully identified, appreciated, or solved by current photodiode and nuclear battery technologies. For example, some embodiments of the present invention pertain to photodiodes and nuclear batteries that utilize actinide oxides, such a uranium oxide.

In an embodiment, an apparatus includes a first actinide oxide layer and a second actinide oxide layer deposited on the first actinide oxide layer. The first actinide oxide layer is n-doped or p-doped. The second actinide oxide layer is p-doped when the first actinide oxide layer is n-doped, and the second actinide oxide layer is n-doped when the first actinide oxide layer is p-doped. The first actinide oxide layer and the second actinide oxide layer form a p/n junction therebetween.

In another embodiment, an actinide oxide photodiode includes a first actinide oxide thin film layer and a second actinide oxide thin film layer deposited on the first actinide oxide layer. The first actinide oxide thin film layer is n-doped or p-doped. The second actinide oxide thin film layer is p-doped when the first actinide oxide thin film layer is n-doped, and the second actinide oxide thin film layer is n-doped when the first actinide oxide thin film layer is p-doped. The first actinide oxide thin film layer and the second actinide oxide thin film layer form a p/n junction therebetween.

In yet another embodiment, an actinide oxide photodiode includes a substrate. The actinide oxide photodiode also includes a first actinide oxide thin film layer deposited on the substrate and a second actinide oxide thin film layer deposited on the first actinide oxide layer. The actinide oxide photodiode further includes a first electrical contact connected to the substrate and a second electrical contact connected to the second actinide oxide thin film layer. The first actinide oxide thin film layer is n-doped or p-doped. The second actinide oxide thin film layer is p-doped when the first actinide oxide thin film layer is n-doped, and the second actinide oxide thin film layer is n-doped when the first actinide oxide thin film layer is p-doped. The first actinide oxide thin film layer and the second actinide oxide thin film layer form a p/n junction therebetween. The first electrical contact is an anode when the first actinide oxide layer is p-doped and the first electrical contact is a cathode when the first actinide oxide layer is n-doped. The second electrical contact is an anode when the second actinide oxide layer is p-doped and the second electrical contact is a cathode when the second actinide oxide layer is n-doped.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments of the present invention pertain to photodiodes and batteries that utilize actinide oxides. Actinide oxides include an element from the actinide series (i.e., actinium (Ac), thorium (Th), protactinium (Pa), uranium (U), *neptunium* (Np), plutonium (Pu), americium (Am), curium (Cm), berkelium (Bk), californium (Cf), einsteinium (Es), fermium (Fm), mendelevium (Md), nobelium (No), or lawrencium (Lr)) and oxygen (O). For instance, actinide oxides such a depleted uranium oxide (DUO), plutonium oxide, and thorium oxide, include molecules of the form $ACTINIDE_xO_y$ (e.g., $U_xO_y$, $Pu_xO_y$, or $Th_xO_y$), where x=1-3 and y=1-8. DUO may be a particularly attractive choice since it is an abundant and relatively cheap waste byproduct of the nuclear fuel enrichment process. DUO is currently produced at a rate of approximately 30,000 tons per year at several de-conversion facilities, and the current practical uses of DUO are limited.

Actinide Oxide Photodiodes

Figure 1:
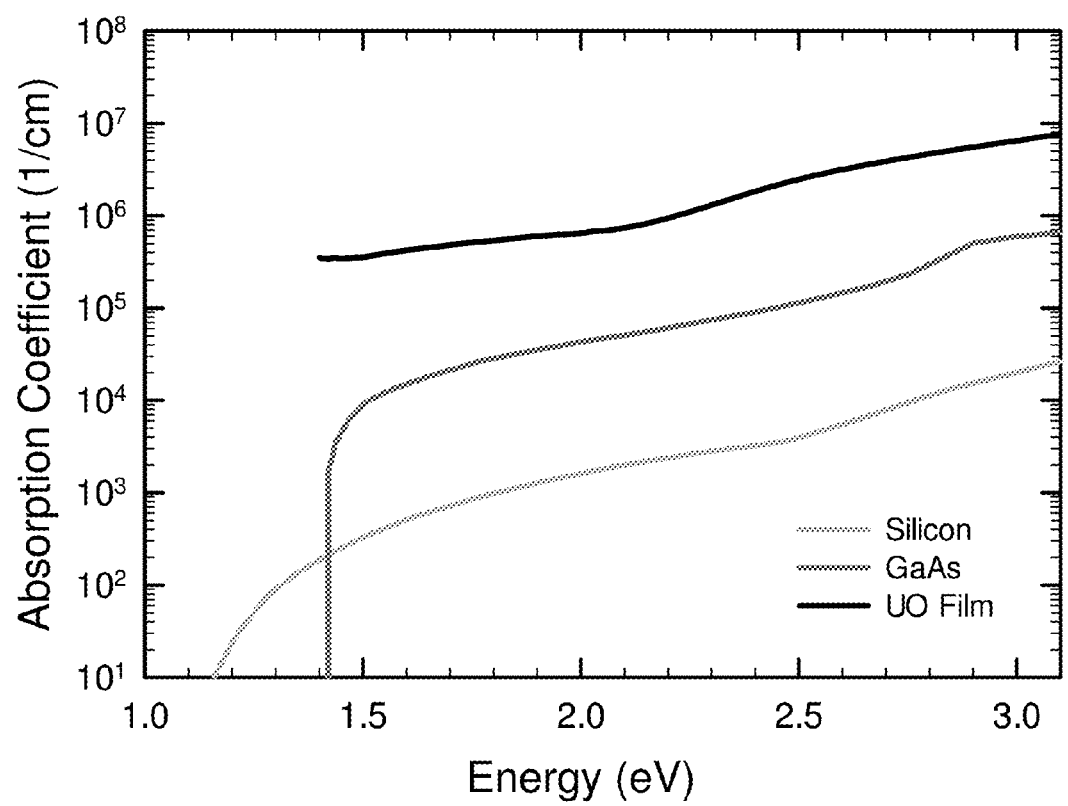
FIG. 1 is a graph illustrating energy versus absorption coefficient for silicon, gallium arsenide, and uranium oxide film, according to an embodiment of the present invention.

Photodiodes including actinide oxides provide various advantages over conventional photodiodes. For instance, they are much better light absorbers than silicon (by about three orders of magnitude), as well as germanium or gallium arsenide (by about one order of magnitude). As an example, the superior absorption coefficients of uranium oxide film at various energies in electron volts (eV) are shown in graph 100 of FIG. 1. Because actinide oxides have higher absorption coefficients, they can be used to produce photodiodes with higher sensitivity. Also, less material (i.e., thinner films) of actinides may be used to achieve the same level of light absorption as Si, Ge, or GaAs. Thus, actinide oxide photodiodes can be lighter than similar devices produced from other semiconductor materials and/or have superior light absorption.

Actinide oxides are also more thermally stable than other semiconductor materials, and actinide oxides have higher resistance to ionizing radiation than conventional semiconductor materials. For example, as measured by critical amorphization dose, uranium oxide is approximately six hundred times more stable than silicon and at least thousand times more stable than gallium arsenide. Thus, actinide oxide photodiodes can be used as effective, superior alternatives to traditional photodiodes for applications requiring operations in harsh environments, such as space, beamline facilities, nuclear power plants, military applications, etc.

Figure 2:
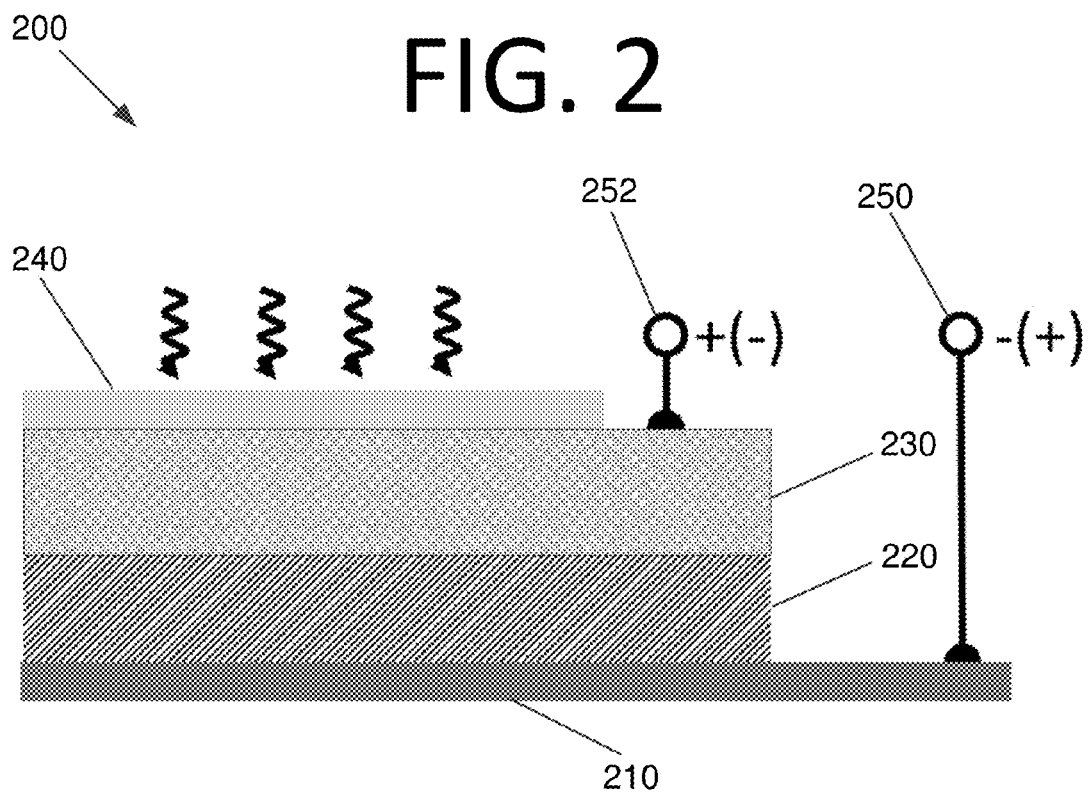
FIG. 2 is a side cutaway view illustrating an actinide oxide photodiode, according to an embodiment of the present invention.

FIG. 2 is a side cutaway view illustrating an actinide oxide photodiode 200, according to an embodiment of the present invention. Actinide oxide photodiode 200 includes a substrate 210 and an n-doped or p-doped actinide oxide thin film 220 deposited thereon. Substrate 210 may be silicon carbide (SiC) or any other suitable substrate. In this embodiment, substrate 210 extends further horizontally than thin film 220. A p-doped or n-doped actinide oxide thin film 230 having the opposite polarity of n-doped or p-doped actinide oxide thin film 220 is deposited thereon. For instance, if thin film 220 is p-doped, thin film 230 is n-doped, and vice versa.

An anti-reflective coating 240 may be deposited on thin film 230, as shown here, to reduce the amount of light reflected back off of thin film 230. Anti-reflective coating 240 may include textured actinide oxide or another suitable actinide material, a dielectric with an appropriately matched refractive index to minimize reflection, or any other suitable material or combination of materials without deviating from the scope of the invention. Thin film 230 extends horizontally further than anti-reflective coating 240 in this embodiment. A pair of electrical contacts 250, 252 are connected to tops of substrate 210 and thin film 230, respectively, where they are not covered by other layers. The polarity of electrical contacts 250, 252 (i.e., whether they are an anode or a cathode) depends on the polarity of thin films 220, 230. For instance, if thin film 220 is n-doped and thin film 230 is p-doped, contact 250 will be a negatively charged cathode and contact 252 will be a positively charged anode. If thin film 220 is p-doped and thin film 230 is n-doped, contact 250 will be a positively charged anode and contact 252 will be a negatively charged cathode.

Figure 3:
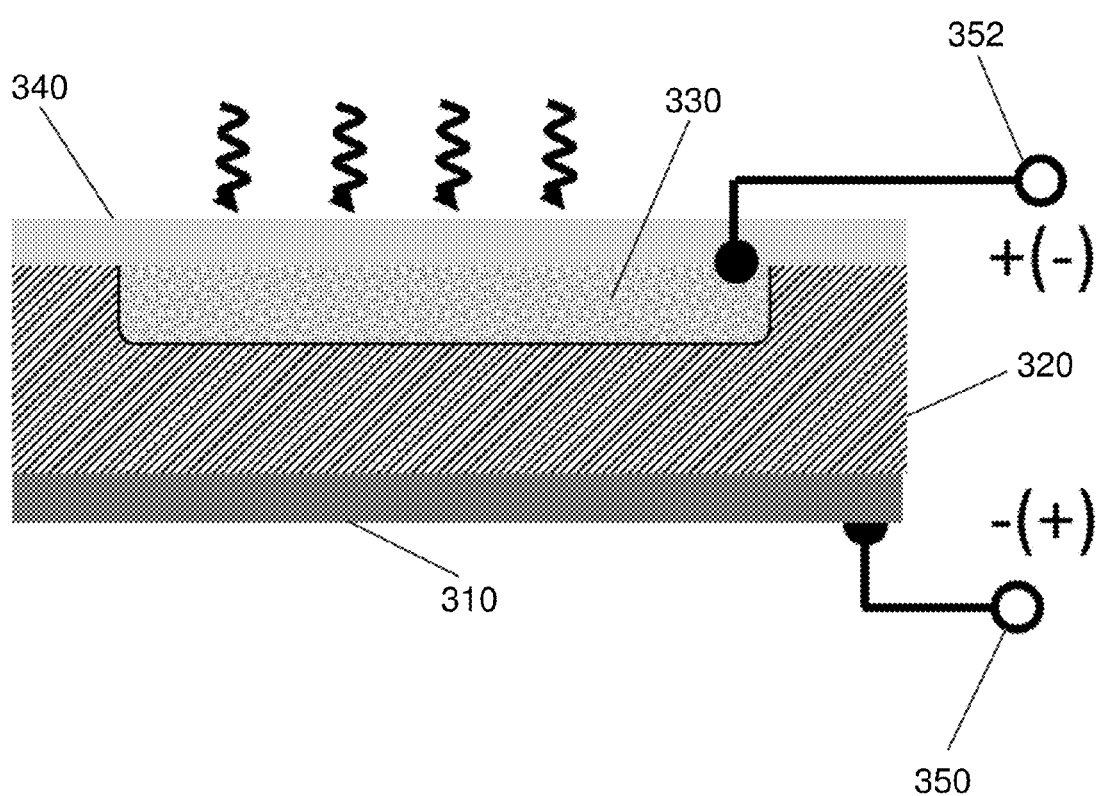
FIG. 3 is a side cutaway view illustrating an actinide oxide photodiode, according to an embodiment of the present invention.

FIG. 3 is a side cutaway view illustrating an actinide oxide photodiode 300, according to an embodiment of the present invention. Similar to photodiode 200 of FIG. 2, actinide oxide photodiode 300 includes a substrate 310, an n-doped or p-doped actinide oxide thin film 320, a p-doped or n-doped actinide oxide thin film 330 having the opposite polarity of n-doped or p-doped actinide oxide thin film 320, an anti-reflective coating 340, and a pair of electrical contacts 350, 352. However, in actinide oxide photodiode 300, thin film 330 is located within a recess in thin film 320. Also, electrical contact 350 is connected to the bottom of substrate 310 and electrical contact 352 extends through anti-reflective coating 340 and is connected to the top of thin film 330. Electrical contact 352 may be created before anti-reflective coating 340 is deposited. In some embodiments, anti-reflective coating 340 is deposited/created around electrical contact 352.

Actinide Oxide Nuclear Batteries

Actinide oxides are semiconductor materials with material properties much more suitable for development of nuclear batteries than conventional semiconductors (e.g., Si, GaAs, etc.). For instance, actinide oxides have significantly higher resistance to ionizing radiation than conventional semiconductor materials. For example, as measured by critical amorphization dose, uranium oxide is approximately six hundred times more stable than silicon and at least thousand times more stable than gallium arsenide. For instance, a silicon solar cell will degrade under radiation in approximately 10-15 minutes. Therefore, actinide oxides can be used to produce nuclear batteries with much higher stability and longer lifetime than conventional materials.

Due to high nuclear Z-numbers, actinides have high stopping power for ionizing radiation and can serve as effective radiation shielding (more efficient than lead, for instance). Therefore, radiation shielding (and thus, the weight and size) of nuclear batteries utilizing actinide oxides as an active component can be reduced as compared to conventional designs. In nuclear battery designs based on direct conversion of alpha, beta, or gamma radiation into charge carriers (electrons and holes), due to the high stopping power of actinides for ionizing radiation, they can convert the radiation to electrical energy with higher efficiency than conventional semiconductor materials.

Per the above, actinide oxides are also much better light absorbers than silicon, germanium, and gallium arsenide. See graph 100 of FIG. 1. Therefore, they can absorb the light produced by a scintillator and convert it to electricity more efficiently than conventional semiconductors. Also, less material (i.e., thinner films) of actinides are needed to achieve the same level of light absorption as Si, Ge, or GaAs. Therefore, the actinide oxide battery can be lighter and smaller than similar devices produced from conventional semiconductor materials.

The Seebeck coefficient for $UO_2$ is three times greater than that observed for $Bi_2Te_3$, which is currently the best known thermoelectric material. The Seebeck coefficient is a measure of thermoelectric efficiency—the higher the value of the coefficient, the better. This indicates that actinide oxides can yield thermoelectric nuclear batteries with higher efficiency than conventional nuclear batteries.

Figure 4:
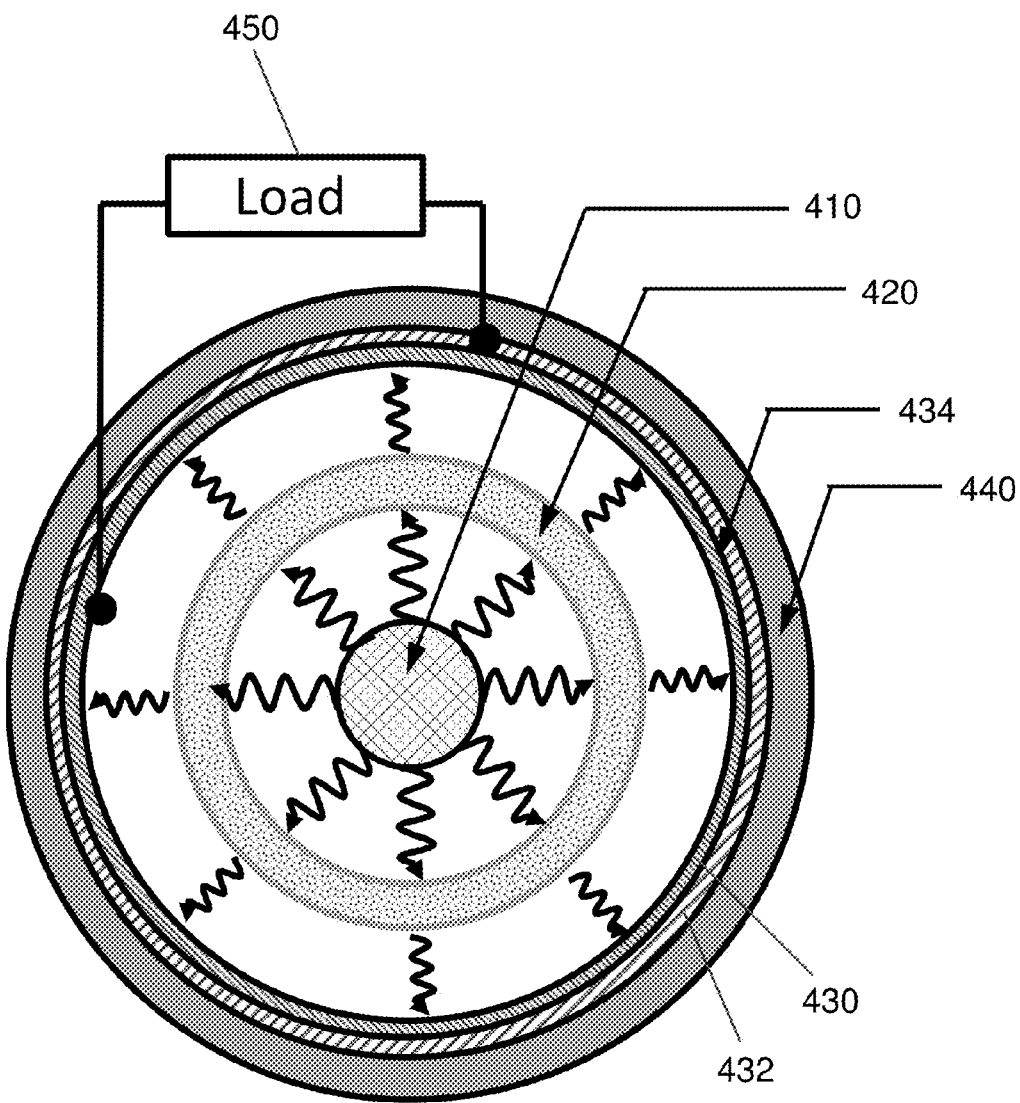
FIG. 4 is a side cutaway view illustrating a cylindrical nuclear battery, according to an embodiment of the present invention.

FIG. 4 is a side cutaway view illustrating a cylindrical nuclear battery 400, according to an embodiment of the present invention. Cylindrical nuclear battery 400 includes an α, β, or γ radiation source 410 surrounded by a liquid or solid scintillator material 420. Liquid scintillators may include, but are not limited to, solutes such as p-terphenyl, 2-(4-Biphenylyl)-5-phenyl-1,3,4-oxadiazole, or other suitable solutes dissolved in organic solvents such benzene, toluene, xylene, or other suitable solvents without deviating from the scope of the invention. Solid scintillators may include, but are not limited to, inorganic crystals such as sodium iodide doped with thallium, organic crystals such as anthracene, plastic materials such as polyethylene naphthalene, and/or any other suitable material without deviating from the scope of the invention. An n-doped or p-doped inner actinide semiconductor material layer 430 surrounds scintillator material 420. An outer actinide semiconductor material layer 432 surrounds inner layer 430 and has the opposite charge, forming a p/n junction 434. A radiation shield 440 surrounds outer layer 432. A load 450 is connected to inner layer 430 and outer layer 432. As current is generated by p/n junction 434, power is provided to load 450 to do work.

Figure 5:
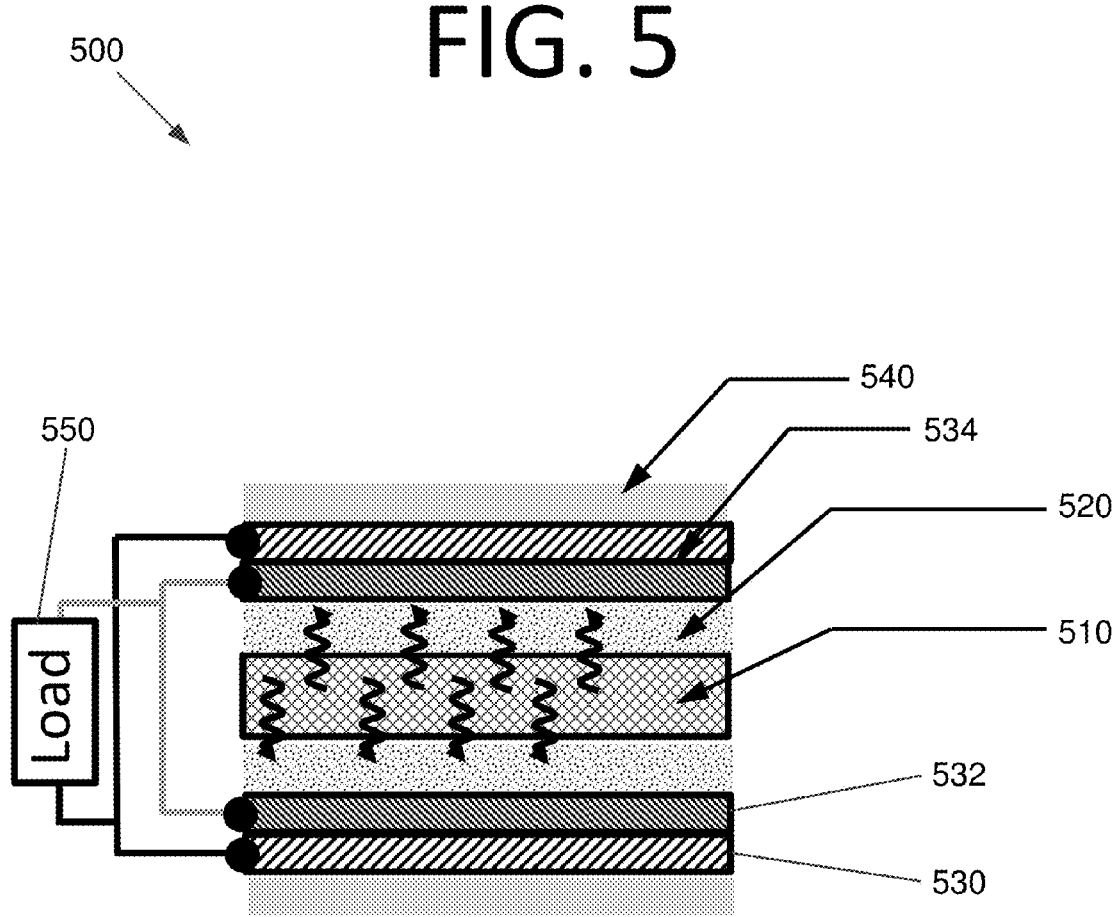
FIG. 5 is a side cutaway view illustrating a power stack nuclear battery, according to an embodiment of the present invention.

FIG. 5 is a side cutaway view illustrating a power stack nuclear battery 500, according to an embodiment of the present invention. In some embodiments, power stack nuclear battery 500 may be cylindrical in shape. However, any suitable shape may be used without deviating from the scope of the invention.

Power stack nuclear battery 500 includes an α, β, or γ radiation source 510 surrounded by a liquid or solid scintillator material 520. An n-doped or p-doped inner actinide semiconductor material layer 530 surrounds scintillator material 520. An outer actinide semiconductor material layer 532 surrounds inner layer 530 and has the opposite charge, forming a p/n junction 534. A radiation shield 540 surrounds outer layer 532. A load 550 is connected to inner layer 530 and outer layer 532. As current is generated by p/n junction 534, power is provided to load 550 to do work.

Fabricating Actinide Oxide Thin Films

Figure 6:
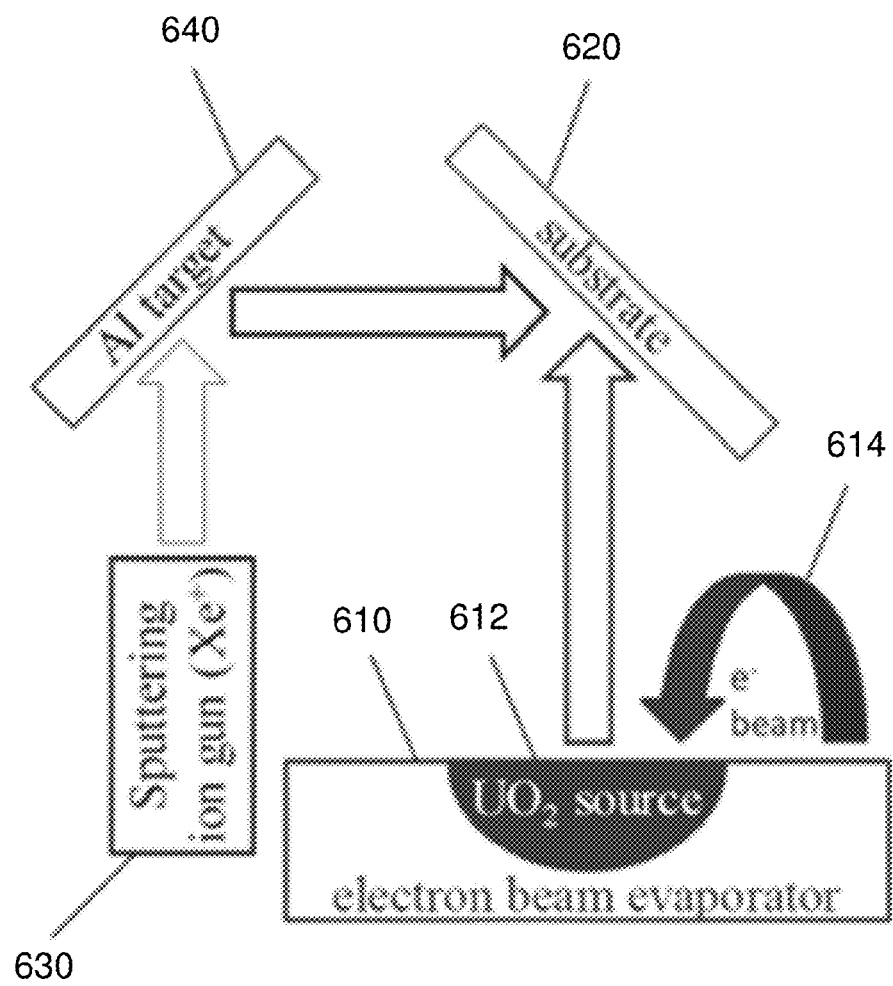
FIG. 6 illustrates a geometry of an IBAD setup for depleted uranium oxide (DUO) film fabrication, according to an embodiment of the present invention.

Actinide oxide thin films can be deposited on variety of substrates using various thin film techniques in some embodiments, including, but not limited to, ion beam assisted deposition (IBAD), spin-coating from solution, etc. The geometry of an IBAD setup 600 (currently state-of-the-art) for uranium oxide film fabrication is shown in FIG. 6. However, this process may be applied to other actinide oxides without deviating from the scope of the invention.

In FIG. 6, an electron beam evaporator 610 evaporates a uranium oxide source (here, $UO_2$ source 612) when an electron beam 614 is applied, providing uranium oxide to a substrate 620. A sputtering Xe+ion gun 630 (or any other suitable energetic ion) sputters an aluminum (Al) target 640 (or other dopant) to allow preparation of n-doped and p-doped thin films.

The oxygen-to-actinide ratio (e.g., 0/U ratio for uranium oxide) can be controlled by changing the partial oxygen pressure during the film deposition, and the film microstructure can be controlled by the deposition temperature and post growth annealing. This allows tuning of the material band gap, as manifested by changes in the film color. Films with large and well-oriented grains, demonstrating single crystal-like microstructure, can be produced even on non-epitaxial substrates, such as SiC. Preparation of p-type and n-type films can be achieved by control of the oxygen-to-actinide ratio (actinide oxides with a metal deficiency are p-type semiconductors and actinide oxides with a metal excess are n-type semiconductors) and/or doping with group III or V elements.

The IBAD set up can be readily modified to produce p-type and n-type films via doping. For instance, Al dopants can be introduced into the actinide oxide matrix by co-sputtering of Al target with Xe+. See FIG. 6. The concentration of Al in the actinide oxide matrix may be controlled by the ratio of actinide oxide/Al deposition rates, which can be precisely adjusted.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
a first actinide oxide layer;
a second actinide oxide layer deposited on the first actinide oxide layer;
a substrate located under the first actinide oxide layer;
a first electrical contact connected to the substrate; and
a second electrical contact connected to the second actinide oxide layer, wherein
the first actinide oxide layer is n-doped or p-doped,
the second actinide oxide layer is p-doped when the first actinide oxide layer is n-doped,
the second actinide oxide layer is n-doped when the first actinide oxide layer is p-doped,
the first actinide oxide layer and the second actinide oxide layer form a p/n junction therebetween,
the first electrical contact is an anode when the first actinide oxide layer is p-doped and the first electrical contact is a cathode when the first actinide oxide layer is n-doped, and
the second electrical contact is an anode when the second actinide oxide layer is p-doped and the second electrical contact is a cathode when the second actinide oxide layer is n-doped.

2. The apparatus of claim 1, wherein the first actinide layer and the second actinide layer comprise a thin film.

3. The apparatus of claim 1, wherein the substrate extends horizontally further than the first actinide layer in at least one direction.

4. The apparatus of claim 1, further comprising:
an anti-reflective coating located on top of the second actinide oxide layer, wherein
the second actinide oxide layer extends horizontally further than the anti-reflective coating in at least one direction.

5. The apparatus of claim 4, wherein
the first electrical contact is connected to a top of the substrate at a location where the substrate is not covered by the first actinide oxide layer, and
the second electrical contact is connected to a top of the second actinide oxide layer at a location where the second actinide oxide layer is not covered by the anti-reflective coating.

6. The apparatus of claim 1, wherein an actinide in the first actinide oxide layer, the second actinide oxide layer, or both, comprises actinium (Ac), thorium (Th), protactinium (Pa), neptunium (Np), plutonium (Pu), americium (Am), curium (Cm), berkelium (Bk), californium (CO, einsteinium (Es), fermium (Fm), mendelevium (Md), nobelium (No), or lawrencium (Lr).

7. The apparatus of claim 1, wherein the first actinide oxide layer, the second actinide oxide layer, or both, comprise at least two of actinium (Ac), thorium (Th), protactinium (Pa), uranium (U), neptunium (Np), plutonium (Pu), americium (Am), curium (Cm), berkelium (Bk), californium (Cf), einsteinium (Es), fermium (Fm), mendelevium (Md), nobelium (No), or lawrencium (Lr).

8. An actinide oxide photodiode, comprising:
a first actinide oxide thin film layer; and
a second actinide oxide thin film layer deposited on the first actinide oxide layer, wherein the first actinide oxide thin film layer is n-doped or p-doped,
the second actinide oxide thin film layer is p-doped when the first actinide oxide thin film layer is n-doped,
the second actinide oxide thin film layer is n-doped when the first actinide oxide thin film layer is p-doped,
the first actinide oxide thin film layer and the second actinide oxide thin film layer form a p/n junction therebetween, and
the first actinide thin film layer comprises a recess in a top surface thereof in which the second actinide oxide thin film layer is deposited.

9. The actinide oxide photodiode of claim 8, further comprising:
a substrate located under the first actinide oxide layer.

10. The actinide oxide photodiode of claim 9, further comprising:
a first electrical contact connected to the substrate; and
a second electrical contact connected to the second actinide oxide layer, wherein the first electrical contact is an anode when the first actinide oxide layer is p-doped and the first electrical contact is a cathode when the first actinide oxide layer is n-doped, and the second electrical contact is an anode when the second actinide oxide layer is p-doped and the second electrical contact is a cathode when the second actinide oxide layer is n-doped.

11. The actinide oxide photodiode of claim 10, further comprising:

an anti-reflective coating located on top of the second actinide oxide layer.

12. The actinide oxide photodiode of claim 11, wherein the first electrical contact is connected to a bottom or side of the substrate, and the second electrical contact is connected to a top of the second actinide oxide layer underneath the anti-reflective coating.

13. The actinide oxide photodiode of claim 8, wherein an actinide in the first actinide oxide thin film layer, the second actinide oxide thin film layer, or both, comprises actinium (Ac), thorium (Th), protactinium (Pa), neptunium (Np), plutonium (Pu), americium (Am), curium (Cm), berkelium (Bk), californium (CO, einsteinium (Es), fermium (Fm), mendelevium (Md), nobelium (No), or lawrencium (Lr).

14. The actinide oxide photodiode of claim 8, wherein the first actinide oxide thin film layer, the second actinide oxide thin film layer, or both, comprise at least two of actinium (Ac), thorium (Th), protactinium (Pa), uranium (U), neptunium (Np), plutonium (Pu), americium (Am), curium (Cm), berkelium (Bk), californium (Cf), einsteinium (Es), fermium (Fm), mendelevium (Md), nobelium (No), or lawrencium (Lr).

15. An actinide oxide photodiode, comprising:

a substrate;

a first actinide oxide thin film layer deposited on the substrate;

a second actinide oxide thin film layer deposited on the first actinide oxide layer;

a first electrical contact connected to the substrate; and a second electrical contact connected to the second actinide oxide thin film layer, wherein the first actinide oxide thin film layer is n-doped or p-doped, the second actinide oxide thin film layer is p-doped when the first actinide oxide thin film layer is n-doped, the second actinide oxide thin film layer is n-doped when the first actinide oxide thin film layer is p-doped, the first actinide oxide thin film layer and the second actinide oxide thin film layer form a p/n junction therebetween, the first electrical contact is an anode when the first actinide oxide layer is p-doped and the first electrical contact is a cathode when the first actinide oxide layer is n-doped, and the second electrical contact is an anode when the second actinide oxide layer is p-doped and the second electrical contact is a cathode when the second actinide oxide layer is n-doped.

16. The actinide oxide photodiode of claim 15, wherein the first actinide thin film layer comprises a recess in a top surface thereof in which the second actinide oxide thin film layer is deposited.

17. The actinide oxide photodiode of claim 15, wherein the first actinide oxide thin film layer, the second actinide oxide thin film layer, or both, comprise at least two of actinium (Ac), thorium (Th), protactinium (Pa), uranium (U), neptunium (Np), plutonium (Pu), americium (Am), curium (Cm), berkelium (Bk), californium (Cf), einsteinium (Es), fermium (Fm), mendelevium (Md), nobelium (No), or lawrencium (Lr).

* * * * *